US012803601B2

(12) United States Patent
Scott et al.

(10) Patent No.: US 12,803,601 B2
(45) Date of Patent: Nov. 17, 2026

(54) MULTIGENERATIONAL FRONT-END MODULE (FEM) WITH 2G VRAMP CAPABILITIES

(71) Applicant: Qorvo US, Inc., Greensboro, NC (US)

(72) Inventors: Baker Scott, San Jose, CA (US); George Maxim, Saratoga, CA (US); Stephen James Franck, Felton, CA (US)

(73) Assignee: Qorvo US, Inc., Greensboro, NC (US)

( * ) Notice: Subject to any disclaimer, the term of this patent is extended or adjusted under 35 U.S.C. 154(b) by 205 days.

(21) Appl. No.: 18/794,212

(22) Filed: Aug. 5, 2024

(65) Prior Publication Data

US 2025/0112651 A1 Apr. 3, 2025

Related U.S. Application Data

(60) Provisional application No. 63/607,736, filed on Dec. 8, 2023, provisional application No. 63/586,870, filed on Sep. 29, 2023.

(51) Int. Cl.
*H04B 1/04* (2006.01)
*H03F 1/02* (2006.01)
(Continued)

(52) U.S. Cl.
CPC ............ *H04B 1/04* (2013.01); *H03F 1/0216* (2013.01); *H03F 3/19* (2013.01); *H03F 3/245* (2013.01);
(Continued)

(58) Field of Classification Search
CPC .... H03F 2200/451; H03F 3/195; H03F 3/245; H03F 2200/294; H03F 3/211; H03F 3/19;
(Continued)

(56) References Cited

U.S. PATENT DOCUMENTS 5,029,298 A * 7/1991 Chiba .................. H03G 3/3042 455/127.5
5,955,927 A * 9/1999 Hamparian .......... H03G 3/3036 330/281
(Continued)

FOREIGN PATENT DOCUMENTS

CN 101098127 A 1/2008
CN 102403990 A 4/2012
(Continued)

OTHER PUBLICATIONS

Balteanu, F. et al., "5G RF Front End Module Architectures for Mobile Applications," Proceedings of the 49th European Microwave Conference, Oct. 1-3, 2019, Paris, France, pp. 252-255.
(Continued)

*Primary Examiner* — Golam Sorowar
(74) *Attorney, Agent, or Firm* — Withrow & Terranova, P.L.L.C.

(57) ABSTRACT

A multigenerational front-end module (FEM) with 2G Vramp capabilities is disclosed. In particular, a FEM having a single transmission path may include a single power amplifier with supporting elements such as for example, bias levels, load modulation, supply voltages, or the like, that may be reconfigured and tuned so as to allow the single power amplifier to adapt effectively and work with different generations of wireless protocols. Further, this multigenerational FEM is able to accommodate a 2G Vramp mode with a multistage power amplifier, each with its own gate or base control signal instead of a collector signal control. This control is further effectuated by efficient power detection.

17 Claims, 15 Drawing Sheets

(51) Int. Cl.
*H03F 3/19* (2006.01)
*H03F 3/24* (2006.01)

(52) U.S. Cl.
CPC .................. *H03F 2200/451* (2013.01); *H04B 2001/0408* (2013.01)

(58) Field of Classification Search
CPC ............... H03F 1/565; H03F 2200/387; H03F 2200/18; H03F 1/0261; H03F 2200/534; H03F 2200/102; H03F 1/0227; H03F 2200/105; H03F 3/213; H03F 3/21; H03F 2200/222; H03F 3/193; H03F 2203/21142; H03F 1/0216; H03F 2200/504; H03F 2200/537; H03F 2200/541; H03F 2203/21106; H03F 3/265; H03F 3/45179; H03F 1/26; H04B 1/40; H04B 1/0475; H04B 2001/045; H04B 1/44; H04B 2001/0433; H04B 1/18; H04B 1/04; H04B 1/0057; H04B 1/406; H04B 1/0458; H04B 1/401; H04B 2001/0408; H04B 7/0413; H04B 1/0483; H10W 20/497; H10W 44/501; H10W 90/724; H10W 90/754; H10W 42/20; H10W 44/231; H10W 44/248; H10W 72/5449; H10W 72/884
See application file for complete search history.

(56) References Cited

U.S. PATENT DOCUMENTS

| | | | | |
|---|---|---|---|---|
| 6,653,902 | B1 * | 11/2003 | Bachhuber ................ | H03F 3/19 330/285 |
| 6,768,382 | B1 * | 7/2004 | Shie ........................ | H03F 1/301 330/296 |
| 7,576,612 | B2 * | 8/2009 | Nakamura ................ | H03F 1/30 330/296 |
| 8,344,806 | B1 | 1/2013 | Franck et al. | |
| 8,599,726 | B2 | 12/2013 | Mikhemar et al. | |
| 10,069,479 | B1 | 9/2018 | Desclos | |
| 10,333,470 | B2 | 6/2019 | Balteanu et al. | |
| 10,587,231 | B2 * | 3/2020 | Shi .......................... | H03F 3/211 |
| 2004/0072554 | A1 * | 4/2004 | Henderson ........... | H03G 3/3042 455/341 |
| 2005/0285681 | A1 * | 12/2005 | Doherty .................... | H03F 1/02 330/297 |
| 2007/0030073 | A1 * | 2/2007 | Tahara .................. | H03F 1/0211 330/285 |
| 2008/0003962 | A1 * | 1/2008 | Ngai ......................... | H03F 1/02 455/179.1 |
| 2011/0018624 | A1 * | 1/2011 | Kobayashi ............. | G01R 21/12 327/574 |
| 2011/0230145 | A1 * | 9/2011 | Lim ...................... | H04W 52/52 455/73 |
| 2012/0139635 | A1 | 6/2012 | Ho et al. | |
| 2013/0027129 | A1 | 1/2013 | Langer | |
| 2014/0218109 | A1 | 8/2014 | Wimpenny | |
| 2015/0148095 | A1 | 5/2015 | Shi et al. | |
| 2016/0094254 | A1 | 3/2016 | Ripley | |
| 2018/0226927 | A1 | 8/2018 | Arkiszewski et al. | |
| 2021/0384876 | A1 | 12/2021 | Lyalin et al. | |
| 2023/0179155 | A1 | 6/2023 | Alon et al. | |
| 2023/0189182 | A1 | 6/2023 | Ballantyne et al. | |
| 2024/0305389 | A1 * | 9/2024 | Abouzied ............... | H03F 1/223 |

FOREIGN PATENT DOCUMENTS

| | | | |
|---|---|---|---|
| CN | 109787569 | A | 5/2019 |
| EP | 2582038 | A1 | 4/2013 |
| EP | 3993261 | A1 | 5/2022 |
| WO | 2023141443 | A1 | 7/2023 |
| WO | 2023150587 | A1 | 8/2023 |
| WO | 2023164036 | A1 | 8/2023 |

OTHER PUBLICATIONS

Extended European Search Report for European Patent Application No. 24202345.5, mailed Feb. 14, 2025, 17 pages.

* cited by examiner

MULTIGENERATIONAL FRONT-END MODULE (FEM) WITH 2G VRAMP CAPABILITIES

PRIORITY APPLICATIONS

The present application claims the benefit of U.S. Provisional Patent Application Ser. No. 63/586,870 filed on Sep. 29, 2023, and entitled "BASE/Gate 2G Vramp CONTROL USING COMPENSATED CLASS-C AND SHARED BIAS LINE FOR I+V POWER SHARING IN CONVERGED PAS," the contents of which are incorporated herein by reference in its entirety.

The present application also claims the benefit of U.S. Provisional Patent Application Ser. No. 63/607,736, filed Dec. 8, 2023, and entitled "MULTIGENERATIONAL FRONT-END MODULE (FEM) WITH 2G VRAMP CAPABILITIES," the contents of which are incorporated herein by reference in its entirety.

RELATED APPLICATIONS

The present application is related to U.S. Provisional Patent Application Ser. No. 63/586,807, filed on Sep. 29, 2023, and entitled "HYBRID RECONFIGURABLE AND CLASS ADAPTIVE CONVERGED 2Glin/2Gvramp/3G/4G/5G TX PATH WITH BUCK-BOOST APT FEMs CURRENT," the contents of which are incorporated herein by reference in its entirety.

The present application is also related to U.S. Provisional Patent Application Ser. No. 63,607,710, filed Dec. 8, 2023, and entitled "MULTIGENERATIONAL FRONT-END MODULE (FEM)," the contents of which are incorporated herein by reference in its entirety.

BACKGROUND

I. Field of the Disclosure

The technology of the disclosure relates generally to a technique to provide a front-end module (FEM) that will work with multiple generations of wireless standards and particularly to one that accommodates 2G Vramp combined with later linear generations.

II. Background

Computing devices abound in modern society, and more particularly, mobile communication devices have become increasingly common. The prevalence of these mobile communication devices is driven in part by the many functions that are now enabled on such devices. Increased processing capabilities in such devices means that mobile communication devices have evolved from pure communication tools into sophisticated mobile entertainment centers, thus enabling enhanced user experiences. With the advent of the myriad functions available to such devices, there has been increased pressure to find ways to increase bandwidth for data transmission to and from the user equipment or other wireless communication devices. This pressure has resulted in the evolution of wireless protocols and a current trend to use higher frequency signals.

While the newer wireless protocols have more bandwidth than the older wireless protocols, the infrastructure deployed to support the older wireless protocols remains deployed in some locales. Accordingly, many wireless communication devices may include circuitry that supports a plurality of wireless protocols. Providing a cost-effective solution that fits within the space available in commercially viable wireless communication devices provides an opportunity for innovation.

SUMMARY

Aspects disclosed in the detailed description include a multigenerational front-end module (FEM) with 2G Vramp capabilities. In particular, a FEM having a single transmission path may include a single power amplifier with supporting elements such as for example, bias levels, load modulation, supply voltages, or the like, that may be reconfigured and tuned so as to allow the single power amplifier to adapt effectively and work with different generations of wireless protocols. Further aspects of the present disclosure contemplate this multigenerational FEM being able to accommodate a 2G Vramp mode with a multistage power amplifier, each with its own gate or base control signal instead of a collector signal control. This control is further effectuated by efficient power detection.

In this regard, in one aspect, a power amplifier chain is disclosed. The power amplifier chain includes a first amplifier comprising a first transistor, a second amplifier comprising a second transistor, the second amplifier serially coupled to the first amplifier, and a power detector coupled to an output of the second amplifier. The power amplifier chain also includes a Vramp control circuit coupled to the power detector and configured to supply a first power control signal to the first transistor at a first base or a first gate based on sensed power from the power detector; and supply a second power control signal to the second transistor at a second base or a second gate based on the sensed power from the power detector.

In another aspect, a wireless communication device comprising a transmitter comprising a power amplifier chain configured to operate across multiple generations of cellular standards, the power amplifier chain is disclosed. The wireless communication device includes a first amplifier comprising a first transistor, a second amplifier comprising a second transistor, the second amplifier serially coupled to the first amplifier, and a power detector coupled to an output of the second amplifier. The wireless communication device also includes a Vramp control circuit coupled to the power detector and configured to supply a first power control signal to the first transistor at a first base or a first gate based on sensed power from the power detector; and supply a second power control signal to the second transistor at a second base or a second gate based on the sensed power from the power detector.

In another aspect, a method of controlling a power amplifier chain is disclosed. The method includes sensing a power level at an output of the power amplifier chain, comparing the power level to a Vramp signal at a Vramp control circuit, and sending power control signals to multiple stages of the power amplifier chains at respective gates or bases of transistors in the multiple stages.

DETAILED DESCRIPTION

Figure 1:
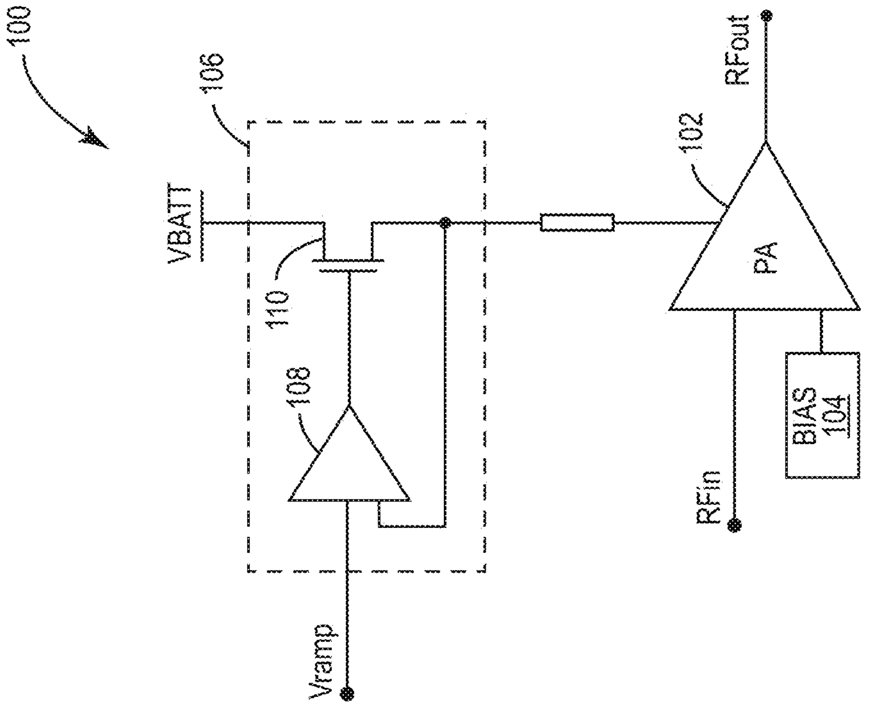
FIG. 1 (RELATED ART)
FIG. 1 is a block diagram of a conventional collector-controlled power amplifier that may be used with 2G Vramp signals.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that although the terms first, second, etc. may be used herein to describe various elements, these elements should not be limited by these terms. These terms are only used to distinguish one element from another. For example, a first element could be termed a second element, and similarly, a second element could be termed a first element without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element, or intervening elements may also be present. In contrast, when an element is referred to as being "directly on" or extending "directly onto" another element, no intervening elements are present. Likewise, it will be understood that when an element such as a layer, region, or substrate is referred to as being "over" or extending "over" another element, it can be directly over or extend directly over the other element, or intervening elements may also be present. In contrast, when an element is referred to as being "directly over" or extending "directly over" another element, no intervening elements are present. It will also be understood that when an element is referred to as being "connected" or "coupled" to another element, it can be directly connected or coupled to the other element, or intervening elements may be present. In contrast, when an element is referred to as being "directly connected" or "directly coupled" to another element, no intervening elements are present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

In keeping with the above admonition about definitions, the present disclosure uses transceiver in a broad manner. Current industry literature uses transceiver both broadly to refer to a plurality of circuits that send and receive signals. Exemplary circuits may include a baseband processor, an up/down conversion circuit, filters, amplifiers, couplers, and the like coupled to one or more antennas. Likewise, some authors in the industry literature refer to a circuit positioned between a baseband processor and a power amplifier circuit as a transceiver. This intermediate circuit may include the up/down conversion circuits, mixers, oscillators, filters, and the like, but generally does not include the power amplifiers. As used herein, the term transceiver is used in the first sense. Where relevant to distinguish between the two definitions, the terms "transceiver chain" and "transceiver circuit" are used respectively.

Aspects disclosed in the detailed description include a multigenerational front-end module (FEM) with 2G Vramp capabilities. In particular, a FEM having a single transmission path may include a single power amplifier with supporting elements such as, for example, bias levels, load modulation, supply voltages, or the like, that may be reconfigured and tuned so as to allow the single power amplifier to adapt effectively and work with different generations of wireless protocols. Further aspects of the present disclosure contemplate this multigenerational FEM being able to accommodate a 2G Vramp mode with a multistage power amplifier each with its own gate or base control signal instead of a collector signal control. This control is further effectuated by efficient power detection.

Before addressing particular aspects of the present disclosure, a brief overview of a traditional control process for a 2G Vramp mode is provided with reference to FIG. 1. A discussion of aspects of the present disclosure begins below with reference to FIG. 2.

In this regard, FIG. 1 is a block diagram of a power amplifier chain 100 operating in a 2G Vramp mode. That is, the second-generation cellular standard (2G) had a linear mode and a Vramp mode. Converging the linear modes into a single power amplifier chain is described in the related applications incorporated above. However, converging the 2G Vramp mode requires some additional power control options. In the past, the 2G Vramp mode power amplifier chain 100 would include one or more power amplifiers 102 that have a bias circuit 104 and a collector control circuit 106. The collector control circuit 106 is typically a low drop-out (LDO) regulator that receives the Vramp signal at a comparator 108. Feedback from a transistor 110 provides the other input for the comparator 108 to keep the input at the gate of the transistor 110 at a desired level, as is well understood. The collector control circuit 106 is generally large, being comparable in size to the transmitter control circuit (not shown) and the actual high-power power amplifier within the power amplifiers 102. As such, the size and cost of a FEM containing such a control circuit are increased. The collector control circuit 106 may also compete with other power management circuits, and a switching circuit may be required to allow access to the collector of the power amplifier 102.

Aspects of the present disclosure contemplate not only a converged power amplifier chain capable of supporting multiple generations of cellular standards but also contemplate changing the power control for 2G Vramp modes such that the large LDO may be eliminated. In this regard, the control is moved away from the collector and to the base or gate of the transistor forming the power amplifier. Changing the location of the control also necessitates a new way to detect power for the Vramp control circuit. Two variations of such power detection are provided in FIGS. 2 and 3.

Figure 2:
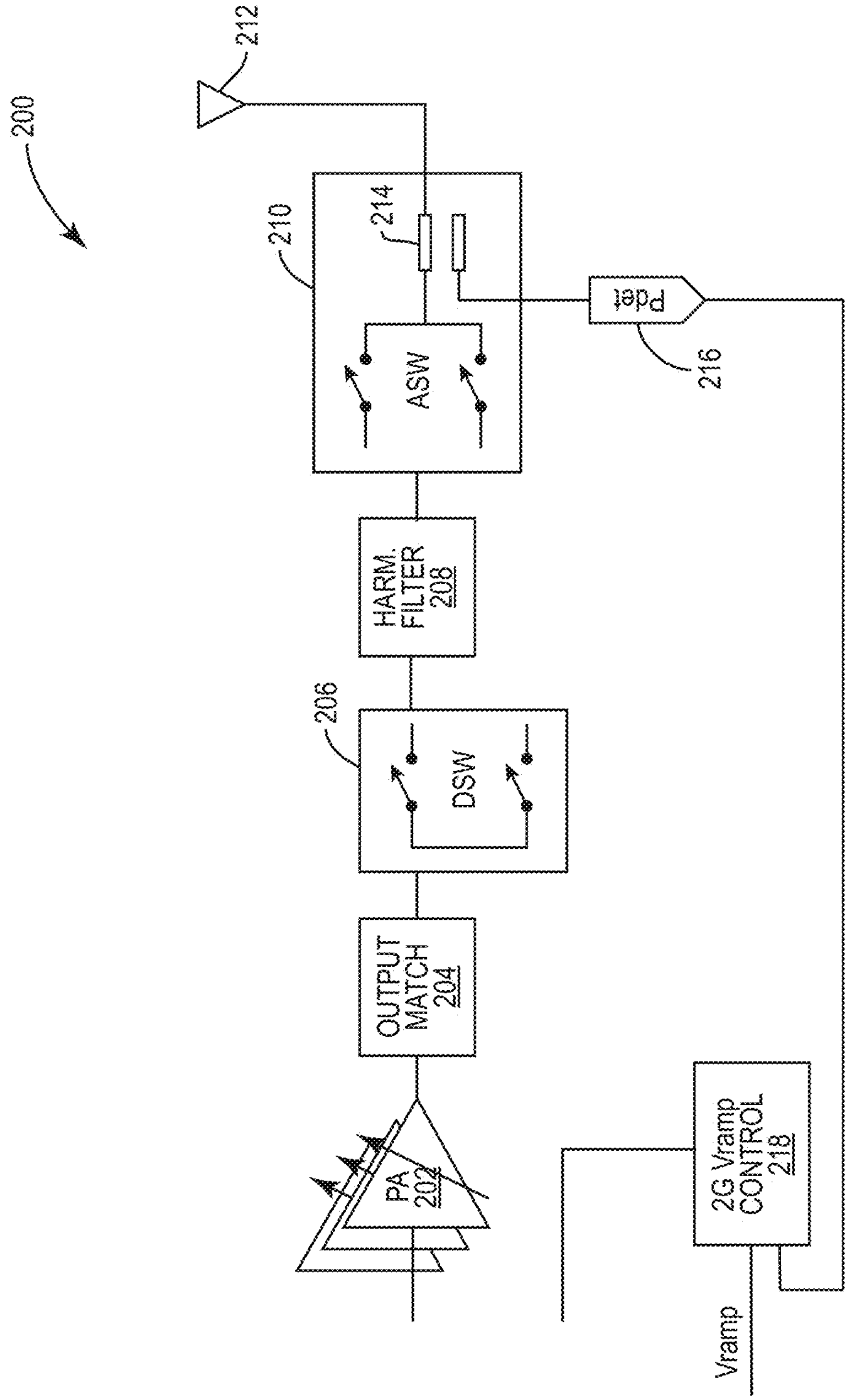
FIG. 2 is a block diagram of an exemplary 2G Vramp capable amplifier chain with power detection at an antenna coupler according to aspects of the present disclosure.

In this regard, FIG. 2 illustrates a transmitter chain 200 having a power amplifier chain 202, an output match circuit 204, a switch 206, a harmonic filter 208, and an antenna switch 210 that is coupled to an antenna 212. Within the antenna switch 210, a coupler 214 may be provided. A power detector 216 may use information from the coupler 214 to provide a detected power signal to a 2G Vramp control circuit 218. The Vramp control circuit 218 may receive a Vramp signal and provide a base or gate control to amplifiers in the power amplifier chain 202, as is better explained below. Note that not every transmitter chain 200 will have a coupler 214. Further, even when there is a coupler 214, other circuits may also use the coupler 214 for power detection or the like, and as such, there may be reasons not to use a power detector 216.

Figure 3:
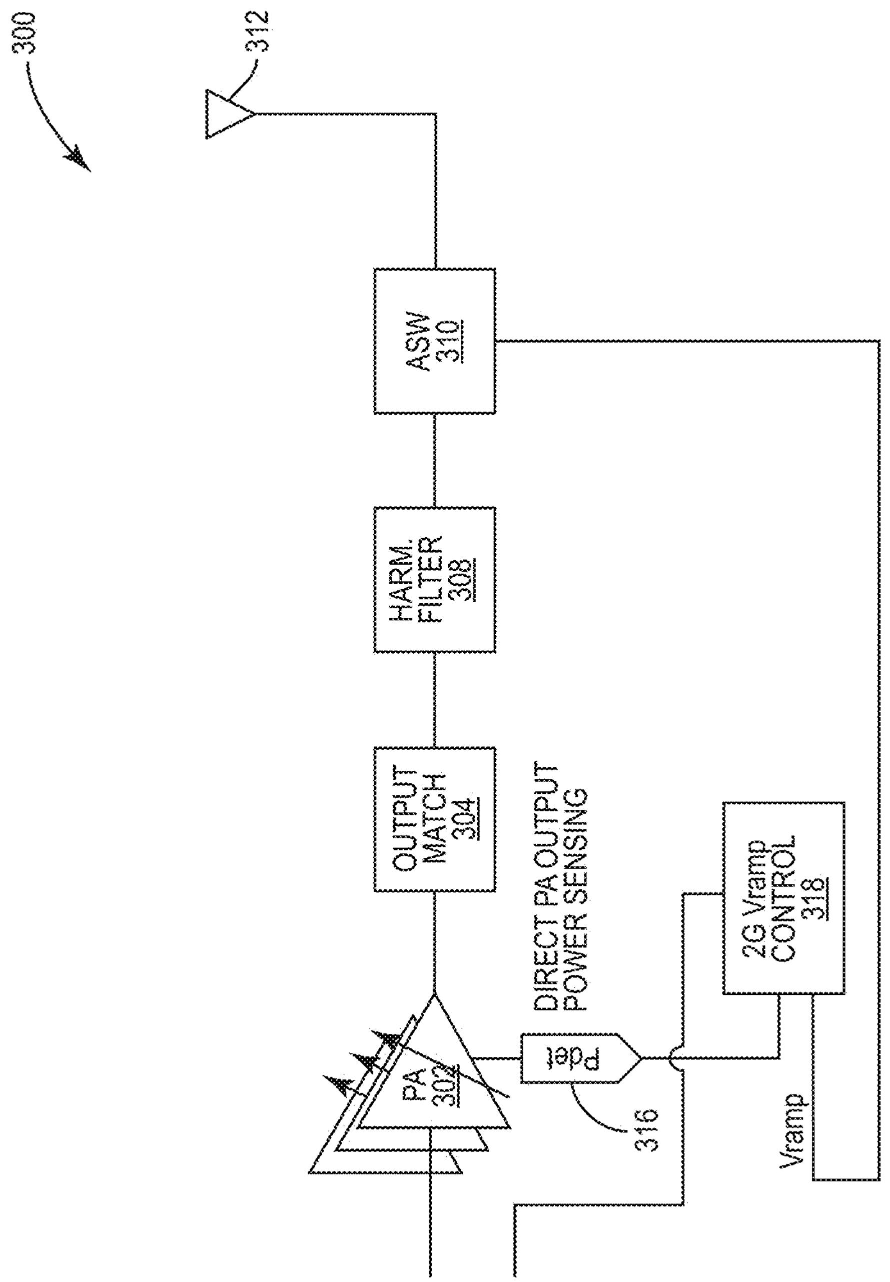
FIG. 3 is a block diagram of an exemplary 2G Vramp capable amplifier chain with power detection at the amplifier according to aspects of the present disclosure.

As an alternative to the power detector 216, FIG. 3 illustrates a transmitter chain 300 having a power amplifier chain 302, an output match circuit 304, a harmonic filter 308, and an antenna switch 310 that is coupled to an antenna 312. A power detector 316 may be coupled to the power amplifier chain 302 (as better illustrated with reference to FIGS. 6 and 7 below). The power detector 316 may provide a detected power signal to a Vramp control circuit 318. The Vramp control circuit 318 may receive a Vramp signal and provide a base or gate control to amplifiers in the power amplifier chain 302, as better explained below.

While FIGS. 2 and 3 generically contemplate how the power detector 216, 316 provides the detected power signal to the Vramp control circuit 218, 318, there are a variety of ways this may be done. It should be appreciated that while the following discussion and examples focus on a structure analogous to that described in FIG. 3, the teachings of the present disclosure are also applicable to the structure of FIG. 2.

Figure 4:
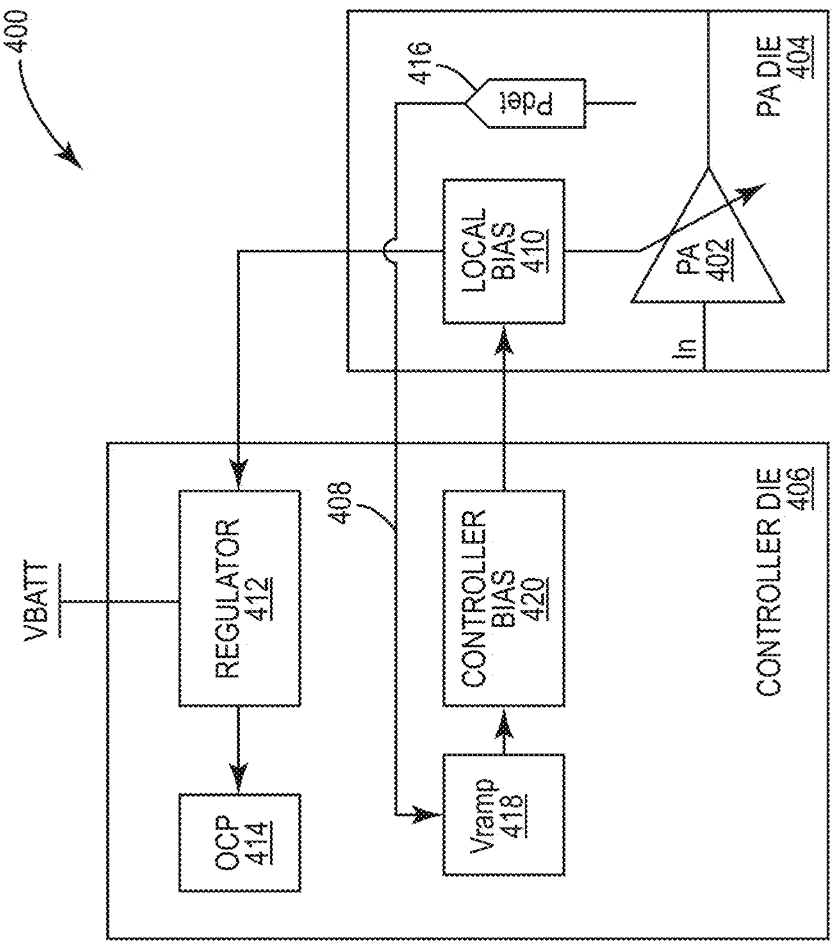
FIG. 4 is a block diagram of a first technique to communicate sensed power to a Vramp bias controller according to aspects of the present disclosure.

A transmitter chain 400 in FIG. 4 may include a power amplifier 402 with a power detector 416 in a power amplifier die 404. In an exemplary aspect, the power amplifier die 404 may be a gallium arsenide (GaAs) die or the like (although a silicon-based die is also possible). A Vramp control circuit 418 may be present in a control die 406. To provide a communication path between the power detector 416 and the Vramp control circuit 418, a dedicated conductor 408 with its own pins (not shown) may be provided. The dedicated conductor 408 and its pins consume additional real estate and may not be optimal. Of interest are the additional pre-existing connections between a local bias circuit 410 and a regulator 412 in the amplifier dice 404, 406, respectively. Additionally, there may be an overcurrent protection (OCP) circuit 414 present in the control die 406. A control bias circuit 420 may also be present in the control die 406 and communicate with the local bias circuit 410.

Figure 5:
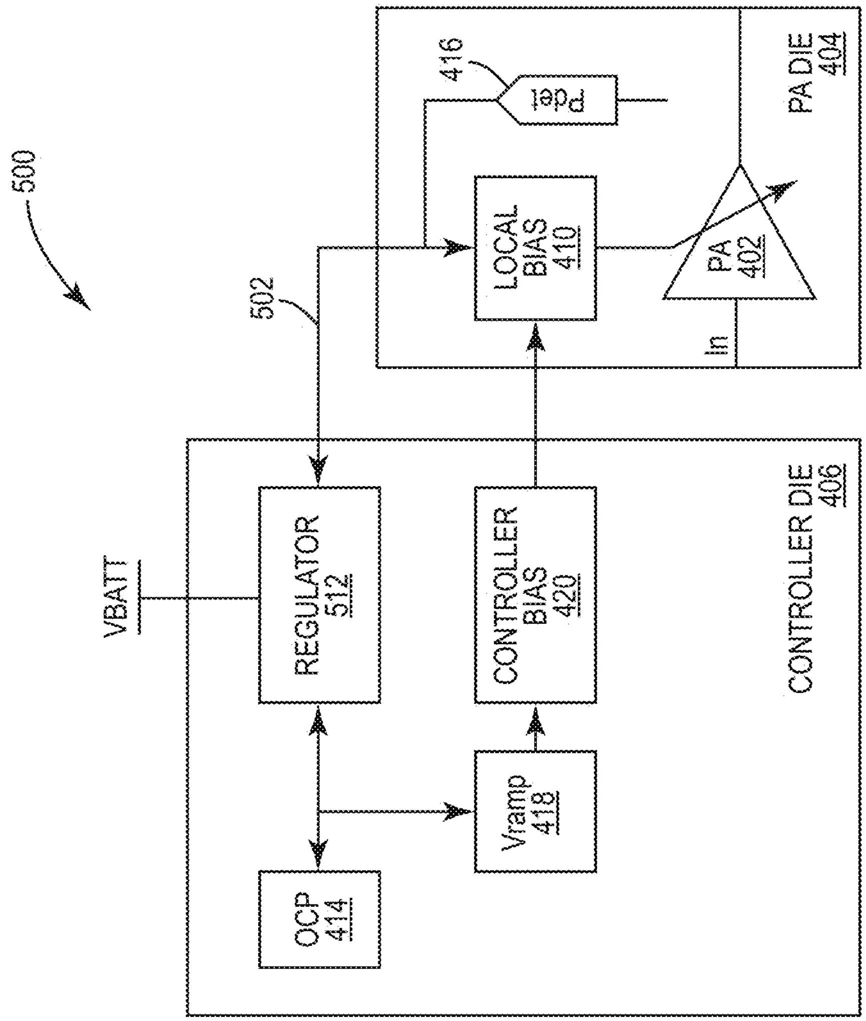
FIG. 5 is a block diagram of a second technique to communicate sensed power to a Vramp bias controller according to aspects of the present disclosure.

Instead of a dedicated line, aspects of the present disclosure contemplate reuse of the connection between the local bias circuit 410 and the regulator 412 as better illustrated in transmitter chain 500 in FIG. 5. Many parts are the same and not renumbered. However, conductor 502 now shares signals going from the regulator 512 to the local bias circuit 410 as well as the detected power signal from the power detector 416. The regulator 512 may also be responsive to the OCP circuit 414 when setting the local bias circuit 410. Note that in general these divergent signals do not conflict in the regulator 512 because the OCP circuit 414 may activate a clipping when the current is high (but the voltage is low) and thus the current alone may be a close proxy of the power detected. Likewise, where the current alone is not a good proxy of the power detected, the OCP circuit 414 is not invoked because the current is generally lower.

Figure 6:
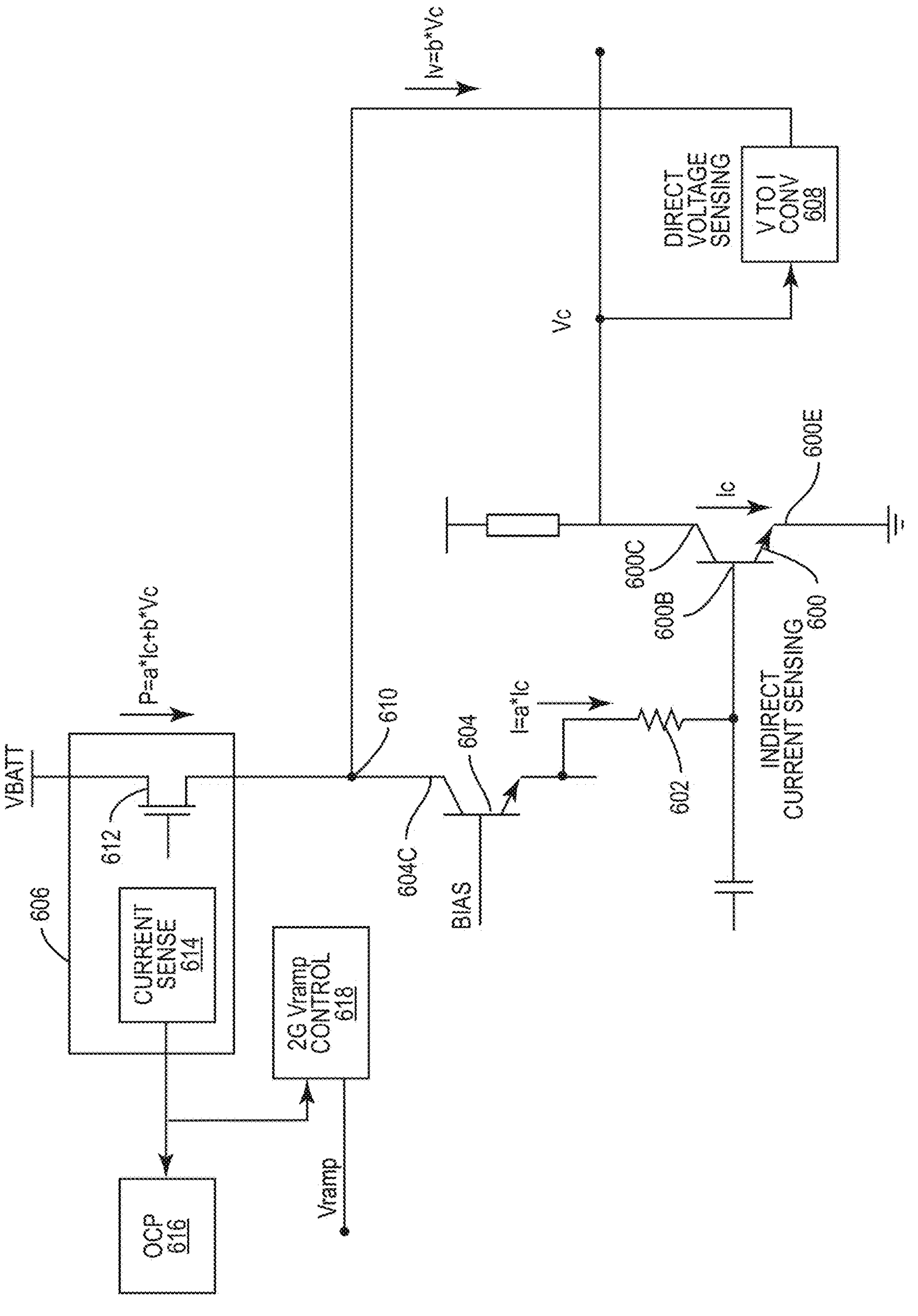
FIG. 6 provides additional details for the second technique of FIG. 5.
Figure 7:
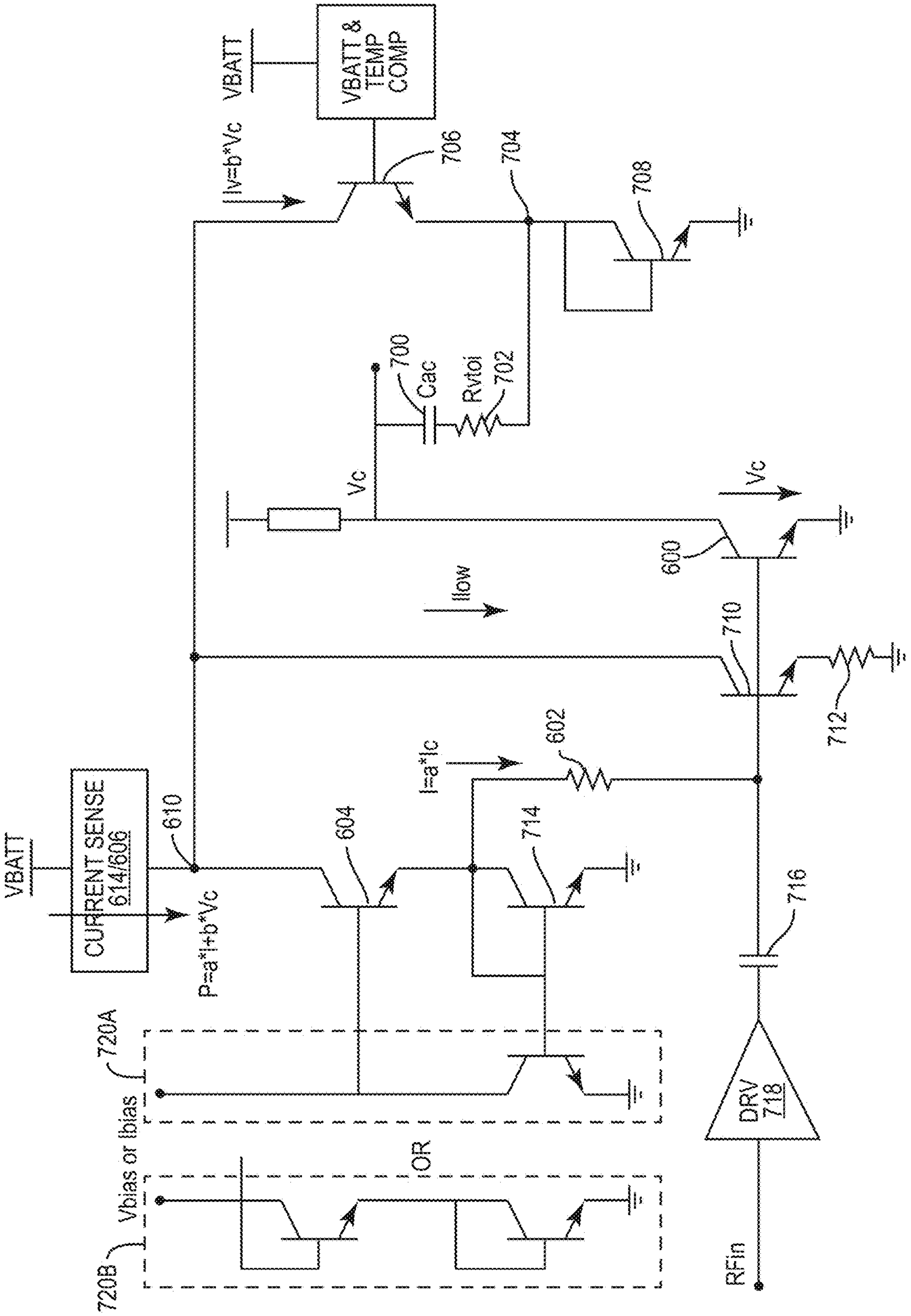
FIG. 7 provides an alternate structure with compensating current during low gain conditions.

To better understand the power detection and how it may interact with the regulator and the OCP circuit, reference is made to FIGS. 6 and 7. In particular, FIG. 6 illustrates an amplifier 600 that may be a bipolar junction transistor (BJT) having a collector 600C, a base 600B, and an emitter 600E. A current Ic flows from the collector 600C to the emitter 600E. An output voltage Vc is present at the collector 600C. It should be appreciated that output power is equal to Vc*Ic. However, a reasonable approximation for this using a Taylor Expansion is P=Vc+Ic. Aspects of the present disclosure provide a way to get a reasonable approximation for P.

The current I flowing from the base 600B to the emitter 600E is proportional to Ic (i.e., I=a*Ic). This current I also flows through a resistor 602 from a bias transistor 604. A collector 604C of the bias transistor 604 may be coupled to a regulator 606 at a node 610. As noted, Vc is present at the collector 600C. This may be sensed by a direct voltage sensor circuit 608 and converted to a current Iv=b*Vc. This current Iv may also be provided to the regulator 606 at the node 610 creating a current sum of a*Ic+b*Vc, which can be used as a proxy for power P. P is provided by a transistor 612 in the regulator 606. A current sensor 614 in the regulator may also work with the OCP circuit 616. The output of the current sensor 614 is provided to the 2G Vramp control circuit 618, which also receives the Vramp signal. While not shown, the Vramp control circuit 618 may control the bias signal provided at the base of the transistor 604.

Additional details are provided in FIG. 7, with an additional circuit added to provide a sensed current (Ilow) for low gain conditions. More specifically, the output voltage Vc is coupled to an alternating current (AC) capacitor 700 and resistor 702 that effectively converts the voltage to a current (i.e., part of direct voltage sensor circuit 608 of FIG. 6). This current is provided to a node 704 between a first transistor 706 and a second transistor 708. A current Iv=b*Vc flows through the transistors 706, 708 and is present at node 610. In addition to the transistor 604, a low gain transistor 710 is coupled to the node 610 and to ground through a resistor 712. The value of the resistor 712 may be chosen such that current Ilow flows in low gain conditions but is negligible at moderate and high gain conditions. Conversely, in low gain conditions Ic may be small, but present in moderate and high gain conditions. Thus, in either condition, a current will be present to be summed with Iv to provide a power approximation. The transistor 604 may be coupled to ground through a transistor 714.

With continued reference to FIG. 7, an AC blocking capacitor 716 may be present at the base 600B and a driver amplifier 718 may provide the input signal RFIN to the transistor 604. Further, a bias input may be provided as a current by circuit 720A or a voltage by circuit 720B. While not shown in FIG. 6, these elements may be present for that circuit without departing from the present disclosure.

Figure 8:
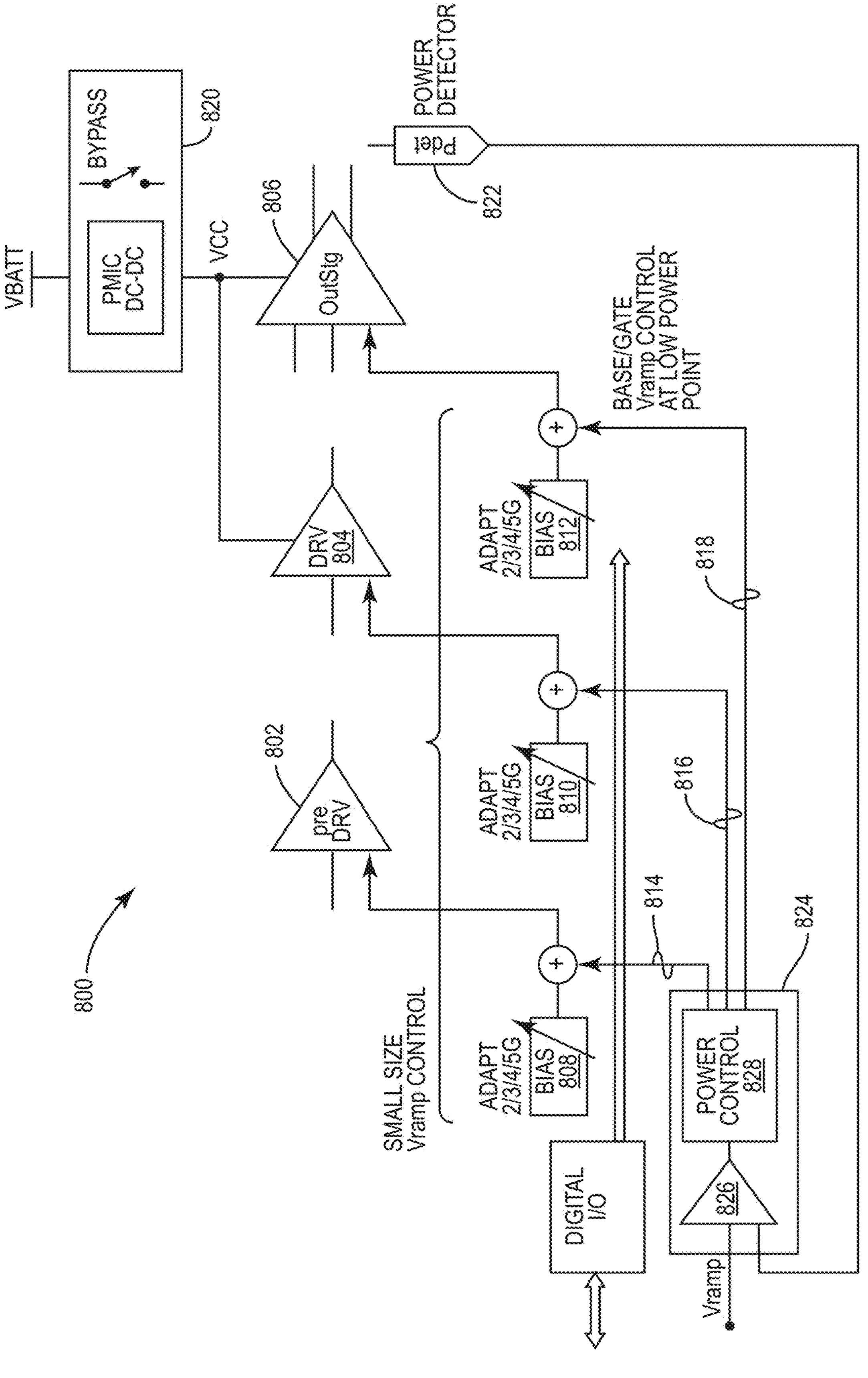
FIG. 8 is a block diagram illustrating the separate bias controls provided to different stages of the power amplifier chain according to exemplary aspects of the present disclosure.

The above discussion has focused on the power detection location and circuitry that would enable detection without a requirement for a separate conductor, but the present disclosure is not limited to just this innovation. The Vramp control circuit may generate separate power control signals for the different amplifiers in an amplifier chain. Specifically, 2G Vramp mode may be at higher power and thus may use a predriver amplifier 802, a driver amplifier 804, and an output amplifier 806 in amplifier chain 800 as illustrated in FIG. 8. Each amplifier 802, 804, 806 may have a respective bias circuit 808, 810, 812 that is separately adjustable to allow for converged operation as explained in the related applications referenced above. The output of the bias circuits 808, 810, and 812 are summed with power control signals 814, 816, and 818, respectively. The driver amplifier 804 and the output amplifier 806 may have a supply voltage provided from a power management integrated circuit (PMIC) 820, which may include a direct current-to-direct current (DC-DC) buck-boost converter. A power detector 822, as previously described (e.g., in FIG. 6 or 7), may provide the detected power signal to the Vramp control circuit 824, which may have a comparator 826 and a power control circuit 828 that uses the output from the comparator 826 to determine the power control signals 814, 816, 818.

Figure 9:
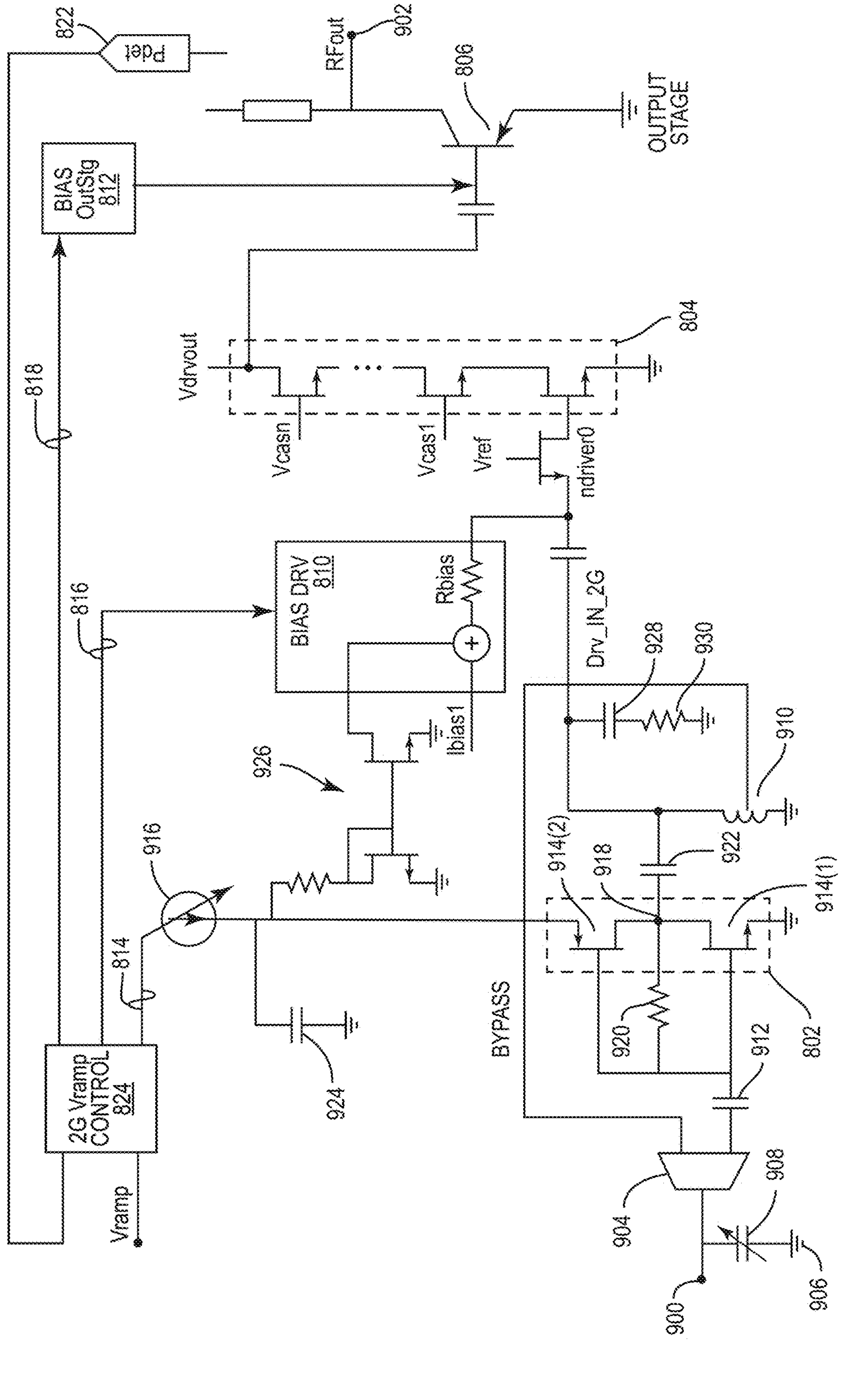
FIG. 9 is a mixed circuit and block diagram illustrating how the Vramp control creates bias signals.

Additional details about the Vramp control and circuitry used to determine the power control signals 814, 816, and 818 are provided in FIG. 9. Many of the elements are the same as in FIG. 8 and are not renumbered. The amplifier chain 800 has an input node 900 and an output node 902.

In particular, the input node 900 is coupled to a multiplexer 904 and a ground 906 through a variable capacitor 908, which may, for example, have a value between 2 and 6 picofarads (although other values are possible). In later generation modalities (i.e., 3G+) the multiplexer 904 sends the input signal past the predriver amplifier 802, such as to an inductor 910 for use by the driver amplifier 804.

However, in the 2G mode, with its higher power requirements, the multiplexer 904 may send the input signal to a blocking capacitor 912 and the predriver transistors 914(1), 914(2). The power control signal 814 controls a variable current source 916, which provides a current to the predriver transistor 914(12). A common node 918 receives the bias signal through a bias resistor 920. The common node 918 also provides an output to a blocking capacitor 922. The arrangement of the predriver circuitry causes the first stage to be a constant output stage.

The current form of the variable current source 916 is also coupled to ground through a capacitor 924 and to a current mirror 926 for the bias circuit 810. As the current varies for the predriver, the current also changes for the bias circuit 810, and thus, a well-controlled predriver also helps control the driver stage. This mirrored current is combined with the bias current (Ibias) before being applied to a gate of the driver amplifier 804. The inductor 910, capacitor 928, and resistor 930 provide a filter to remove harmonics and impedance match for the driver amplifier 804.

Figure 10:
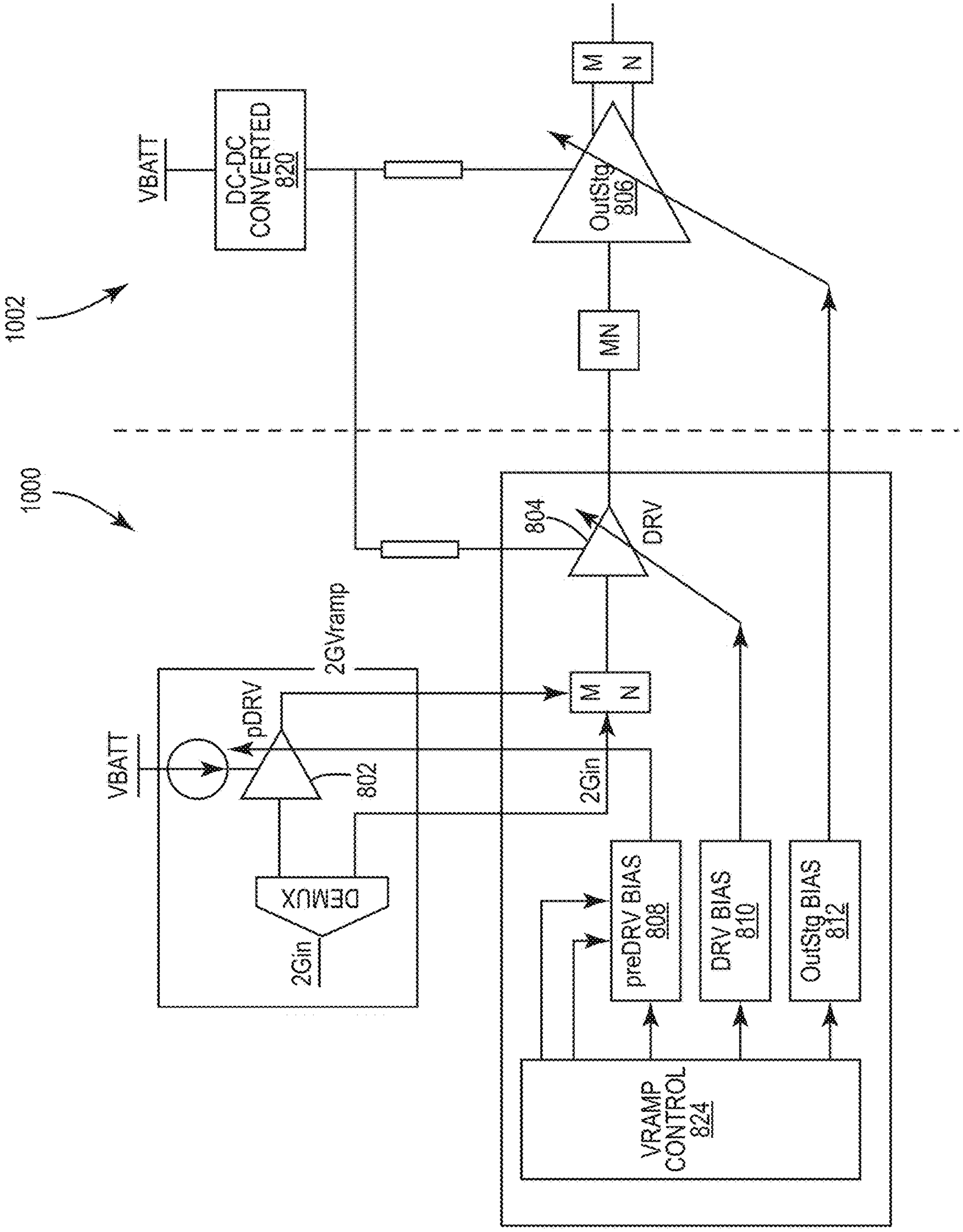
FIG. 10 is a block diagram illustrating how aspects of the present disclosure may be distributed between silicon and gallium arsenide (GaAs) chips.

FIG. 10 illustrates an optional technology split. That is, the predriver amplifier 802 and the driver amplifier 804 may be implemented in digital or CMOS die 1000, and the output amplifier may be in a GaAs die 1002.

Figure 11:
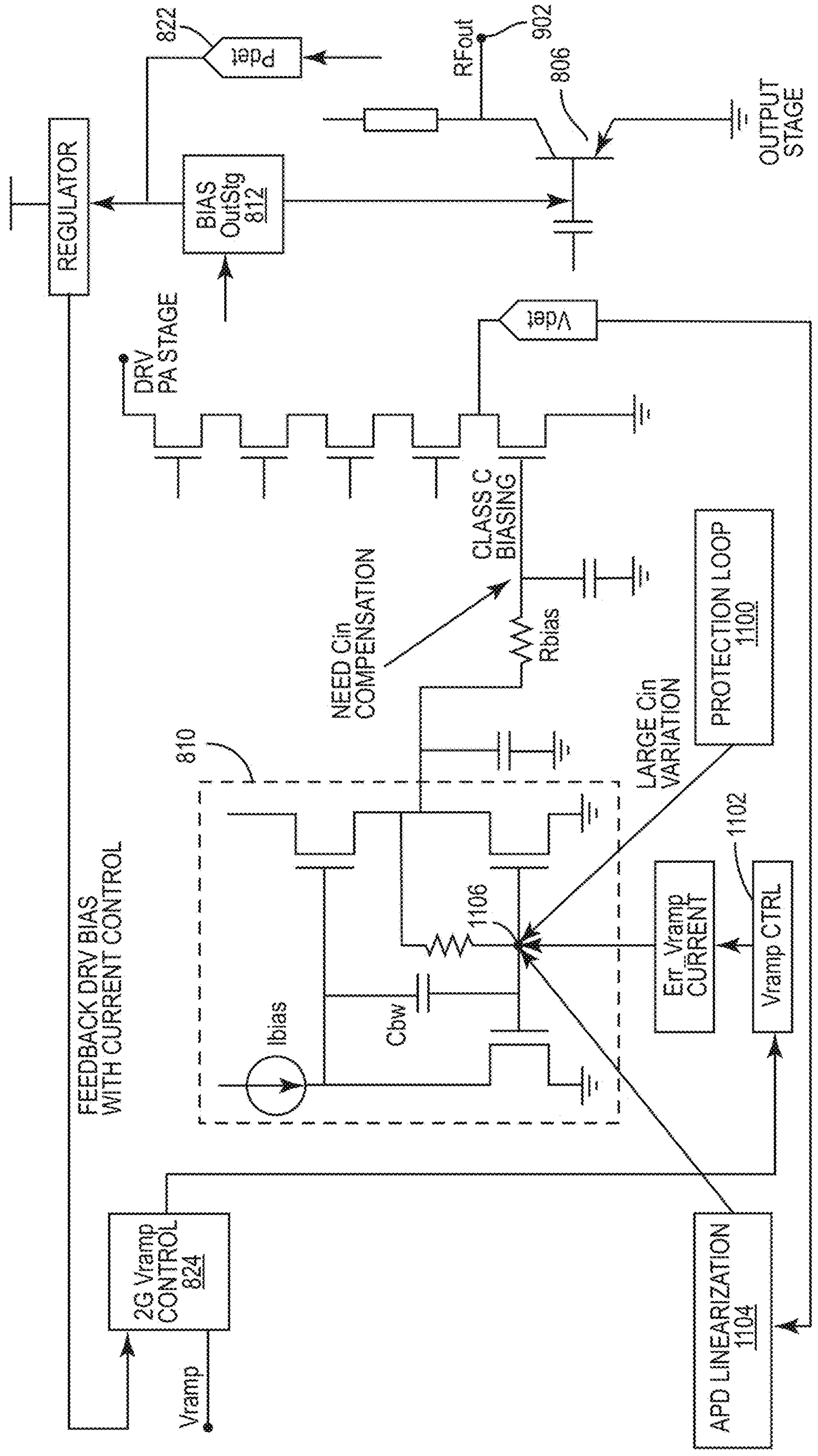
FIG. 11 is a mixed circuit and block diagram illustrating how different elements may interact with the bias circuits and corresponding impedance compensation that may be provided.
Figures 12A, 12B:
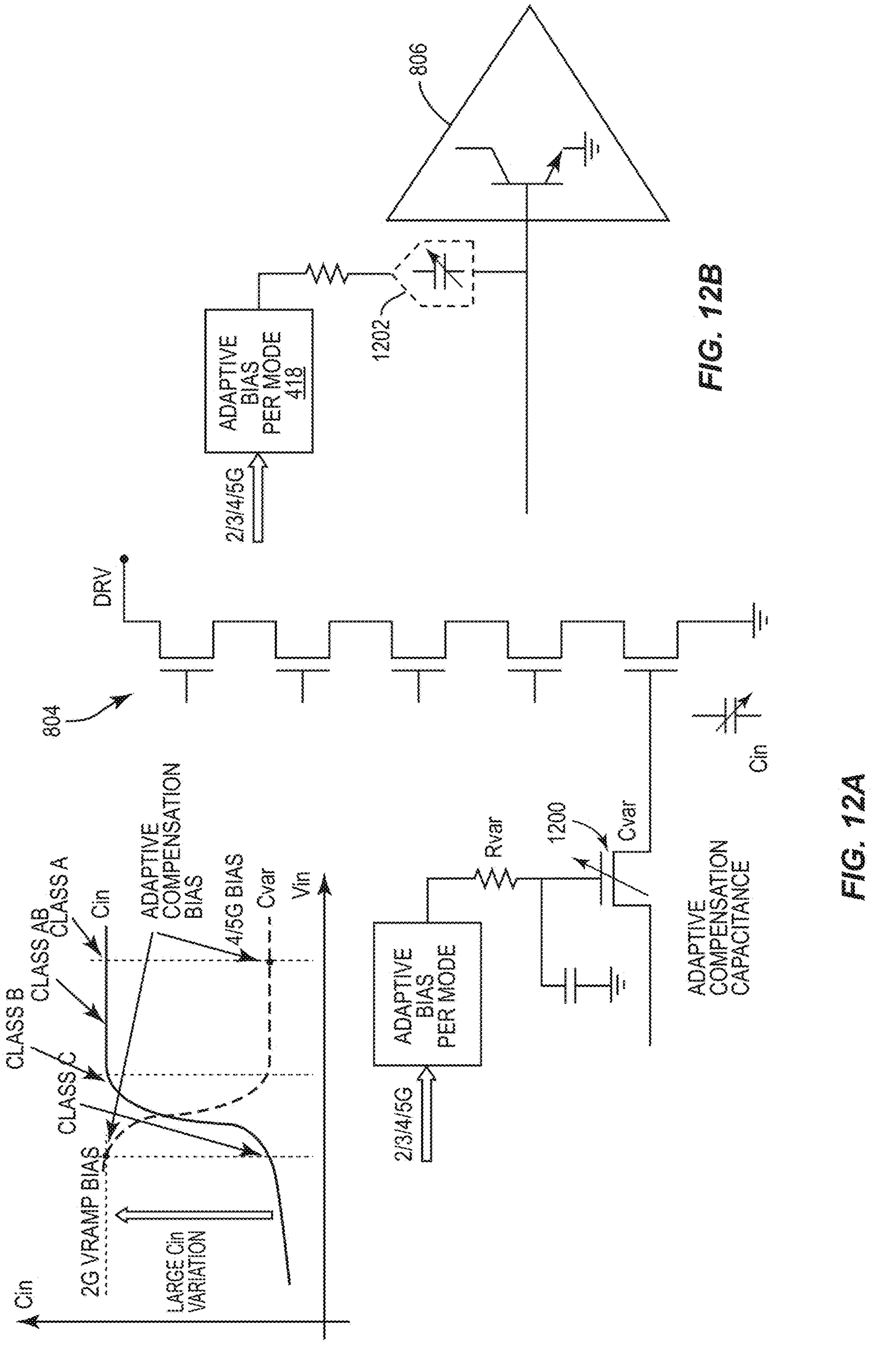
FIGS. 12A and 12B illustrate how impedance compensation may be provided for silicon or GaAs technologies respectively.

Note further that aspects of the present disclosure play well with protection loops, as previously described above, and analog predistortion (APD) circuits as better seen in FIG. 11, where the bias circuit 810 is coupled to a protection loop 1100, the Vramp control signal 1102, and the APD linearization circuit 1104 may all provide input signals to a node 1106 in the bias circuit 810. Because the different actions (Vramp, protection, and APD) may have different requirements, there may be a need for different impedances. For example, in Vramp mode, the transistors may be operating in class C mode, and this may result in large capacitance variation relative to class A or class AB. Thus, a variable capacitance 1200 or 1202 may be added, as illustrated in FIGS. 12A and 12B.

Figure 13:
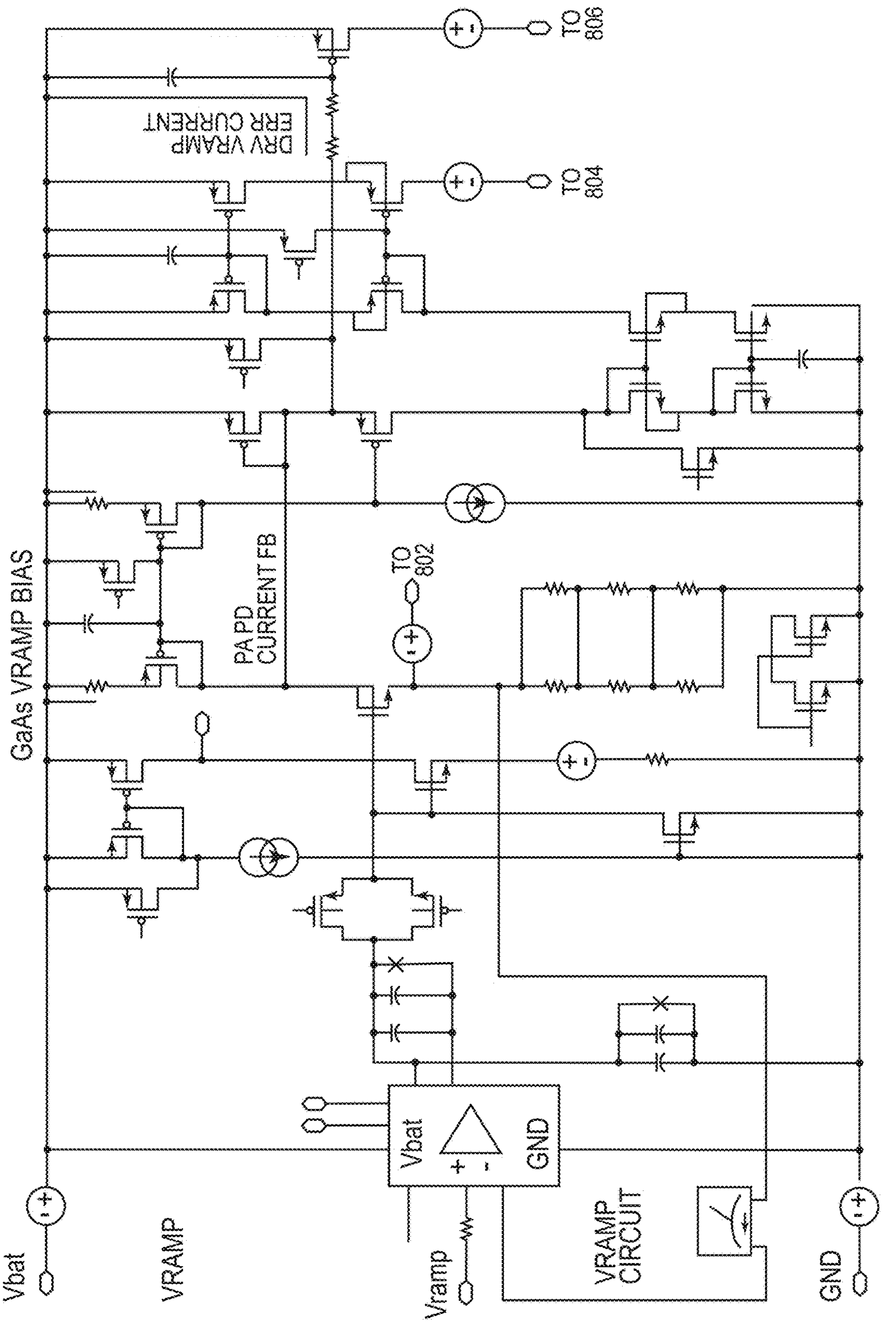
FIG. 13 is a circuit diagram illustrating an exemplary circuit for aspects of the present disclosure.

FIG. 13 is a more specific circuit implementation of various bias circuitry 1300 provided to show the best mode as of the time of this writing. It is not intended to be limiting and is only offered for illustration. Simulations based on this circuit show that an operating range of fifty to sixty decibels is possible and able to meet the stringent standards of modern cell phones and wireless standards.

Figure 14:
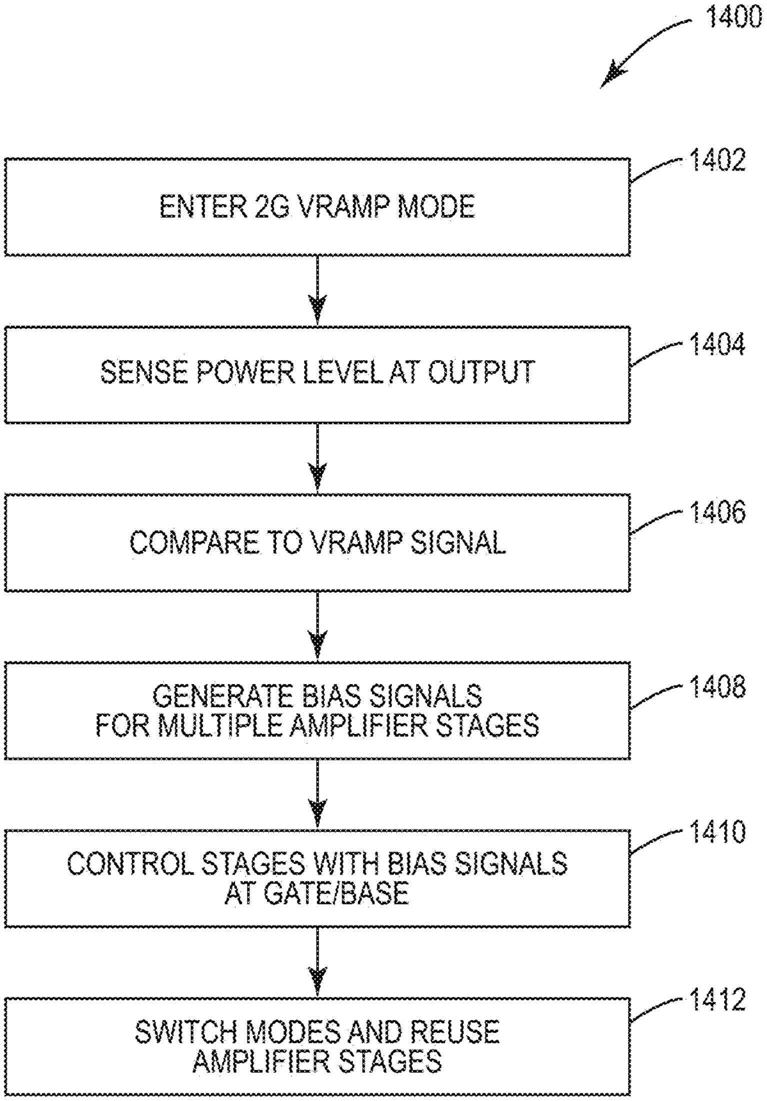
FIG. 14 is a flowchart illustrating an exemplary process for controlling bias for a converged multigenerational power amplifier chain according to aspects of the present disclosure.

The process of the present disclosure is set forth in FIG. 14. In particular, the process 1400 begins with a wireless transceiver or user element 1500 entering a 2G Vramp mode (block 1402). A power level is sensed at a power amplifier output (block 1404), such as by measuring a current and voltage and summing them. The detected power is compared to a Vramp signal (block 1406), and bias signals are generated for multiple amplifier stages (block 1408), such as a predriver, a driver, and an output stage. The bias signals control the stages at a gate or base (block 1410). Further, the user element 1500 may switch to a different cellular generation mode and reuse the power amplifier stages (block 1412).

Figure 15:
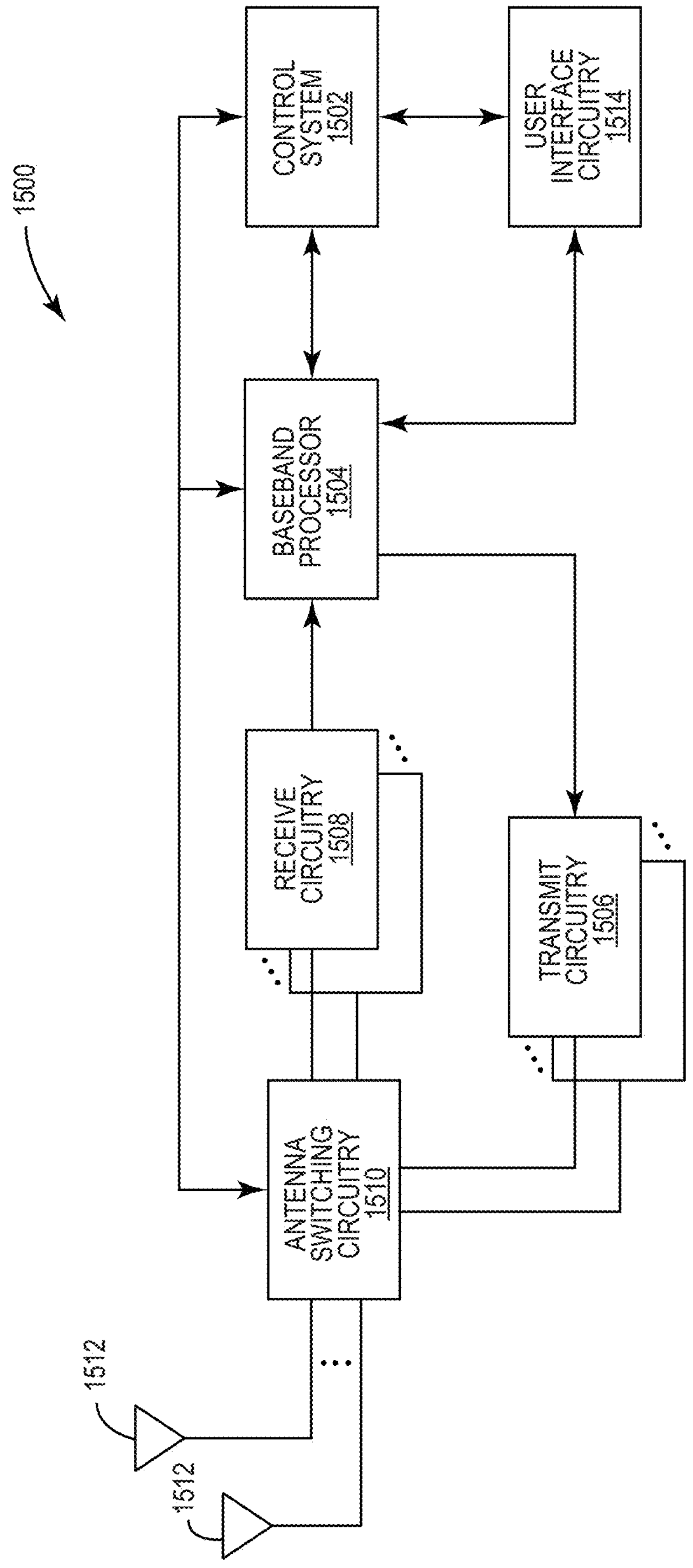
FIG. 15 is a block diagram of a mobile terminal, which may include the converged multigenerational power amplifier chain of FIGS. 2-13 according to the present disclosure.

With reference to FIG. 15, the concepts described above may be implemented in various types of user elements 1500, such as mobile terminals, smart watches, tablets, computers, navigation devices, access points, and like wireless communication devices that support wireless communications, such as cellular, wireless local area network (WLAN), Bluetooth, and near field communications. The user elements 1500 will generally include a control system 1502, a baseband processor 1504, transmit circuitry 1506, receive circuitry 1508, antenna switching circuitry 1510, multiple antennas 1512, and user interface circuitry 1514. In a non-limiting example, the control system 1502 can be a field-programmable gate array (FPGA) or an application-specific integrated circuit (ASIC), as an example. In this regard, the control system 1502 can include at least a microprocessor(s), an embedded memory circuit(s), and a communication bus interface(s). The receive circuitry 1508 receives radio frequency signals via the antennas 1512 and through the antenna switching circuitry 1510 from one or more base stations. A low noise amplifier and a filter of the receive circuitry 1508 cooperate to amplify and remove broadband interference from the received signal for processing. Downconversion and digitization circuitry (not shown) will then downconvert the filtered, received signal to an intermediate or baseband frequency signal, which is then digitized into one or more digital streams using an analog-to-digital converter(s) (ADC).

The baseband processor 1504 processes the digitized received signal to extract the information or data bits conveyed in the received signal. This processing typically comprises demodulation, decoding, and error correction operations. The baseband processor 1504 is generally implemented in one or more digital signal processors (DSPs) and ASICs.

For transmission, the baseband processor 1504 receives digitized data, which may represent voice, data, or control information, from the control system 1502, which it encodes for transmission. The encoded data is output to the transmit circuitry 1506, where a digital-to-analog converter(s) (DAC) converts the digitally encoded data into an analog signal, and a modulator modulates the analog signal onto a carrier signal that is at a desired transmit frequency or frequencies. A power amplifier will amplify the modulated carrier signal to a level appropriate for transmission and deliver the modulated carrier signal to the antennas 1512 through the antenna switching circuitry 1510 to the antennas 1512. The multiple antennas 1512 and the replicated transmit and receive circuitries 1506, 1508 may provide spatial diversity. Modulation and processing details will be understood by those skilled in the art.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications, as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein but is to be accorded the widest scope consistent with the principles and novel features disclosed herein.

What is claimed is:

1. A power amplifier chain comprising:
- a first amplifier comprising a first transistor having a first gate or a first base;
- a second amplifier comprising a second transistor, the second amplifier serially coupled to the first amplifier;
- a power detector coupled to an output of the second amplifier, the power detector configured to convert an output voltage to an output current, the power detector comprising a current sensor at the first base or the first gate of the first transistor and a voltage sensor at an output of the second transistor;
- a low gain circuit comprising:
  - a low gain transistor having a current summed with the output current; and
  - a resistor coupling the low gain transistor to ground, wherein the low gain transistor is configured to draw a current for the power detector during low power conditions; and
- a Vramp control circuit coupled to the power detector and configured to:
  - supply a first power control signal to the first transistor at a first base or a first gate based on sensed power from the power detector; and
  - supply a second power control signal to the second transistor at a second base or a second gate based on the sensed power from the power detector.

2. The power amplifier chain of claim 1, wherein the first transistor comprises a field effect transistor (FET) and the first power control signal is supplied to the first gate.

3. The power amplifier chain of claim 2, wherein the second transistor comprises a bipolar junction transistor (BJT) and the second power control signal is supplied to the second base.

4. The power amplifier chain of claim 1, wherein the second amplifier is configured to operate in a linear mode for multiple cellular standard generations and a 2G Vramp mode.

5. The power amplifier chain of claim 1, further comprising a power management integrated circuit (PMIC) comprising a direct current-to-direct current (DC-DC) converter coupled to the second transistor at a second collector.

6. The power amplifier chain of claim 1, further comprising a predriver amplifier positioned serially in front of the first amplifier and coupled to the Vramp control circuit, wherein the Vramp control circuit is further configured to provide a third power control signal to the predriver amplifier.

7. The power amplifier chain of claim 1, wherein the power detector is configured to sense power at an antenna coupler.

8. The power amplifier chain of claim 1, further comprising an over current protection circuit coupled to the first amplifier and configured to share a feedback line with the power detector.

9. A wireless communication device comprising a transmitter comprising a power amplifier chain configured to operate across multiple generations of cellular standards, the power amplifier chain comprising:
- a first amplifier comprising a first transistor having a first gate or a first base;
- a second amplifier comprising a second transistor, the second amplifier serially coupled to the first amplifier;

a power detector coupled to an output of the second amplifier, the power detector configured to convert an output voltage to an output current, the power detector comprising a current sensor at the first base or the first gate of the first transistor and a voltage sensor at an output of the second transistor;

a low gain circuit comprising:

a low gain transistor having a current summed with the output current; and a resistor coupling the low gain transistor to ground, wherein the low gain transistor is configured to draw a current for the power detector during low power conditions; and a Vramp control circuit coupled to the power detector and configured to:

supply a first power control signal to the first transistor at a first base or a first gate based on sensed power from the power detector; and supply a second power control signal to the second transistor at a second base or a second gate based on the sensed power from the power detector.

10. A method of controlling a power amplifier chain comprising:

sensing a power level at an output of the power amplifier chain comprising a first amplifier comprising a first transistor and a second amplifier comprising a second transistor serially coupled to the first amplifier, wherein sensing the power level comprises sensing a power level at an output of the second amplifier with a power detector comprising a current sensor associated with the first transistor and a voltage sensor at the output of the second transistor;

drawing current during low gain conditions with a low gain transistor;

comparing the power level to a Vramp signal at a Vramp control circuit; and sending power control signals to multiple stages of the power amplifier chains at respective gates or bases of transistors in the multiple stages.

11. The method of claim 10, further comprising switching from a Vramp mode to a linear mode.

12. The method of claim 10, wherein sensing the power level comprises sensing at an antenna coupler.

13. The method of claim 10, wherein sensing the power level comprises summing a current at a base of a transistor and a converted current from an output of the transistor.

14. The method of claim 13, further comprising providing a supply voltage to the power amplifier chain at the output of the transistor.

15. The method of claim 10, wherein sensing the power level comprises sensing before an antenna switch.

16. The method of claim 10, further comprising entering a 2G Vramp mode of operation.

17. The method of claim 10, further comprising generating bias signals for multiple amplifier stages.

* * * * *